(12) United States Patent
Kawabata et al.

(10) Patent No.: US 9,599,754 B2
(45) Date of Patent: Mar. 21, 2017

(54) OPTICAL ELEMENT ARRAY AND SOLID-STATE IMAGING DEVICE INCLUDING THE ARRAY

(71) Applicant: CANON KABUSHIKI KAISHA, Tokyo (JP)

(72) Inventors: Kazunari Kawabata, Kawasaki (JP); Jun Iba, Yokohama (JP); Zempei Wada, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/009,646

(22) Filed: Jan. 28, 2016

(65) Prior Publication Data

US 2016/0146981 A1    May 26, 2016

Related U.S. Application Data

(63) Continuation of application No. 14/313,857, filed on Jun. 24, 2014, now Pat. No. 9,285,510.

(30) Foreign Application Priority Data

Jun. 28, 2013 (JP) ................................. 2013-137050

(51) Int. Cl.
    *G02B 3/00* (2006.01)
    *G02B 3/04* (2006.01)
    *H01L 27/146* (2006.01)
(52) U.S. Cl.
    CPC .......... *G02B 3/0043* (2013.01); *G02B 3/0037* (2013.01); *G02B 3/0056* (2013.01); *G02B 3/04* (2013.01); *H01L 27/14627* (2013.01)

(58) Field of Classification Search
    CPC .. G02B 3/0037; G02B 3/0056; G02B 3/0043; G02B 3/04; H01L 27/14627
    See application file for complete search history.

(56) References Cited

U.S. PATENT DOCUMENTS

2009/0174945 A1*   7/2009  Lin ................... B29D 11/00365
                                                           359/619

FOREIGN PATENT DOCUMENTS

JP         2000-039503 A      2/2000
JP         2004-347693 A     12/2004

* cited by examiner

*Primary Examiner* — Whitney T Moore
(74) *Attorney, Agent, or Firm* — Canon USA Inc., IP Division

(57) ABSTRACT

An optical element array includes a plurality of optical elements arranged along a first direction and a second direction. A first optical element is included at a position distanced from a center of the optical element array by a first distance. The first optical element has a first width, a first height, and a first curvature radius at the first position, and a second width, a second height, and a second curvature radius at a second position. The first width is wider than the second width, the first height is higher than the second height, and the first curvature radius is smaller than the second curvature radius. The first position and the second position are taken along a single direction.

11 Claims, 11 Drawing Sheets

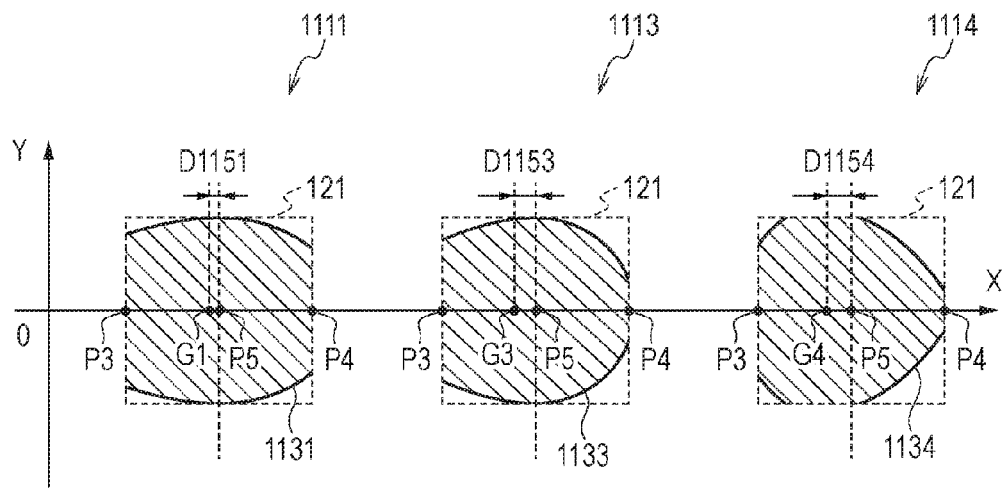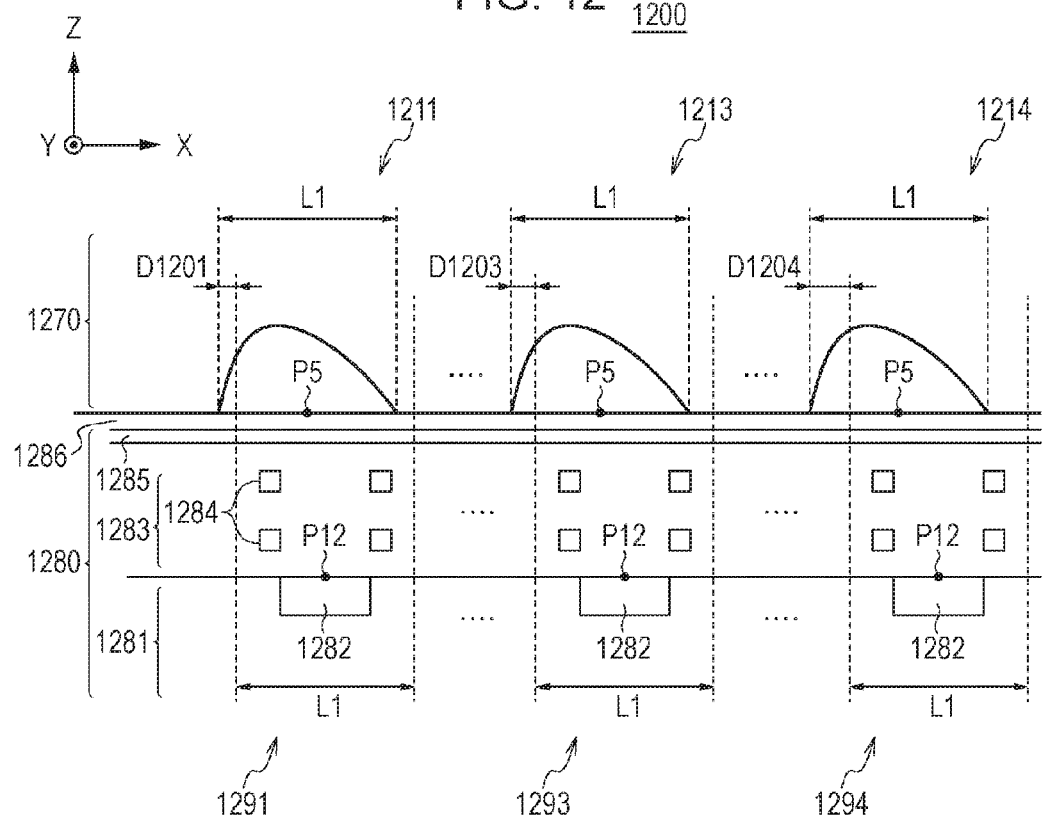

OPTICAL ELEMENT ARRAY AND SOLID-STATE IMAGING DEVICE INCLUDING THE ARRAY

CROSS-REFERENCE TO RELATED APPLICATIONS

This application is a Continuation of co-pending U.S. patent application Ser. No. 14/313,857 filed Jun. 24, 2014, which claims foreign priority benefit of Japanese Patent Application No. 2013-137050, filed Jun. 28, 2013. The disclosures of the above-named applications are hereby incorporated by reference herein in their entirety.

BACKGROUND OF THE INVENTION

Field of the Invention

The present invention relates to an optical element array and a solid-state imaging device including the optical element array.

Description of the Related Art

Optical element arrays such as microlens arrays are used in solid-state imaging devices and display apparatuses. Japanese Patent Application Laid-Open No. 2007-335723 discloses a microlens having a teardrop form, and a solid-state imaging device equipped with an array of microlenses having the teardrop form for efficiently collecting incident light from a diagonal direction. The microlens having the teardrop form has a curved shape that gradually narrows toward the exterior side of the solid-state imaging device when seen from the planar view, and has a vertex at the end of the exterior side.

According to the microlens disclosed in Japanese Patent Application Laid-Open No. 2007-335723, the area occupancy ratio of the microlens lowers when seen from the planar view. Light incident on a portion of the solid-state imaging device not provided with a microlens is not collected, which lowers the area occupancy ratio and decreases the amount of light collected. In addition, according to the microlens disclosed in Japanese Patent Application Laid-Open No. 2007-335723, a portion where the radius of curvature of the teardrop form is small is included, so there is a possibility that the light collection ability is limited.

SUMMARY OF THE INVENTION

An optical element array according to one or more embodiments of present disclosure includes multiple first optical elements disposed along a first direction, in which the first optical element is positioned from the center of an array region where the multiple optical elements are disposed by a first distance along the first direction. The first optical element has a bottom face that coincides with a face including the first direction and a section direction orthogonal to the first direction. The bottom face has a first width along the second direction positioned at a first position in the first direction within the first optical element, and a second width narrower than the first width along the second direction positioned at a second position further from the center of the array region than the first position in the first direction within the first optical element. The first optical element has a first curvature radius and a first height that is the highest point within a first cross section when the first cross section is taken along the second direction at the first position, and a second curvature radius larger than the first curvature radius and a second height lower than the first height, which is the highest point within a second cross section when taking the second cross section along the second direction at the second position.

An optical element array according to other embodiments of present disclosure includes multiple first optical elements disposed along a first direction, in which the first optical element is positioned from the center of the array region where the multiple optical elements are disposed by a first distance along the first direction. The first optical element has a bottom face in the face including the first direction and a section direction orthogonal to the first direction. The bottom face has a first width along the second direction positioned at a first position in the first direction within the first optical element, and a second width narrower than the first width along the second direction positioned at a second position further from the center of the array region than the first position in the first direction within the first optical element. The first optical element has a first height that is the highest point within a first cross section when the first cross section is taken along the second direction at the first position, and a second height lower than the first height, which is the highest point within a second cross section when taking the second cross section along the second direction at the second position. The second position is positioned to the outer edge of the bottom face.

Further features of the present invention will become apparent from the following description of exemplary embodiments with reference to the attached drawings.

BRIEF DESCRIPTION OF THE DRAWINGS

FIG. 11 is a planar schematic describing an optical element array according to a Sixth Embodiment.

FIG. 12 is a cross-sectional schematic describing a solid-state imaging device according to a Seventh Embodiment.

DESCRIPTION OF THE EMBODIMENTS

A configuration of an optical element of the present disclosure will be described using multiple embodiments.

Each embodiment may be modified or combined. The optical element array can be applied to a solid-state imaging device and a display apparatus, and to an imaging system using the solid-state imaging device and a display system using the display apparatus.

Figure 1A:
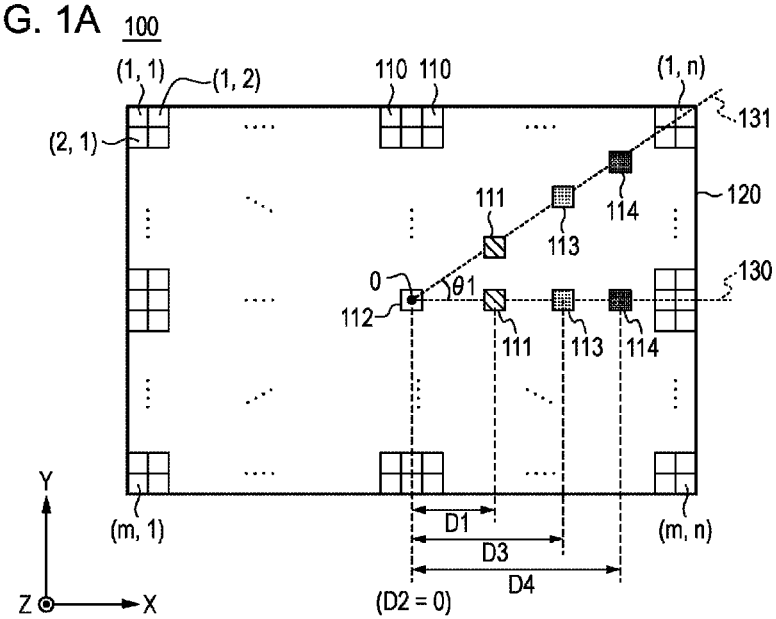
FIGS. 1A and 1B are planar schematics describing an optical element array according to a First Embodiment.
Figure 1B:
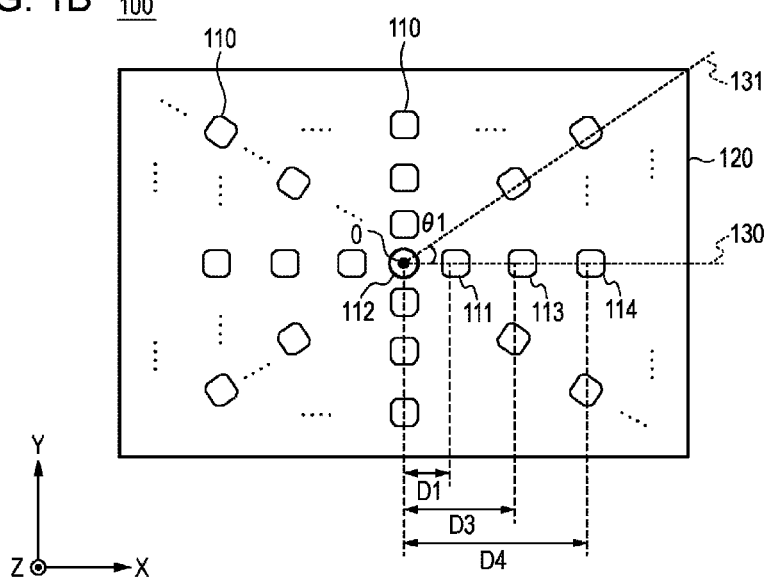

The following description uses the X axis direction (first direction), also referred to simply as "X axis", and the Y axis direction (second direction) also referred to simply as "Y axis", from a center O as reference, but the present invention is not limited thusly. For example, a direction 131 inclined at an angle θ1 from the X axis as illustrated in FIGS. 1A and 1B can be designated as the first direction, and the direction that is orthogonal to the direction 131 can be designated as the second direction. That is to say, any direction radiating from the center of the region where the optical element is arranged (array region) toward the perimeter can be designated as the first direction, and any direction orthogonal to this can be designated as the second direction.

First Embodiment

The optical element array according to the present embodiment will be described with reference to FIGS. 1 through 7. FIG. 1A is a planar schematic describing an optical element array 100. The optical element array 100 includes multiple optical elements 110. An array region 120 includes a center O and is where the multiple optical elements 110 are disposed. The multiple optical elements 110 are arranged in a matrix (two dimensional) consisting of an n number of columns along the X axis (n is a natural number) and an m number of rows along the Y axis (m is a natural number) on a face (plane) including the X axis and the Y axis. The multiple optical elements along one direction (X axis) are disposed in the array region 120, which can be set so that center of each optical element is positioned on the line representing the single direction. The coordinates of each optical element 110 are illustrated in FIG. 1A. Hereafter, the description will focus on first optical element 111 through fourth optical element 114.

The first optical element 111 through the fourth optical element 114 are any optical elements positioned on a line 130 along the X axis at a distance from the center O. The optical elements are arranged on this line from the center O of the array region 120 to the periphery (outer edge) of the array region 120 in order from the second optical element 112 to the first optical element 111, the third optical element 113, and then the fourth optical element 114. Similar optical elements are positioned on any line 131, which is a line rotated from the line 130 around the center O by the amount of angle θ1.

The first optical element 111 is positioned at a distance D1 (first distance) from the center O of the array region 120. The second optical element 112 is positioned at a distance D2 (second distance) from the center O of the array region 120. The third optical element 113 is positioned at a distance D3 (third distance) from the center O of the array region 120. The fourth optical element 114 is positioned at a distance D4 (fourth distance) from the center O of the array region 120. The position of the optical element when measuring the distance is the position of the center of the optical element along the X axis. The center of the second optical element 112 is in the same position as the center O of the array region 120, and the distance of the second distance D2 is zero. However, the center O of the array region 120 and the center of the second optical element 112 do not have to match. The relationship between these distances can be expressed as $D2=0<D1<D3<D4$. The distance from the center O of the array region 120 represents the distance from the center O to the center of each optical element along a single direction (X axis).

FIG. 1B is a more specific planar schematic of the optical element array 100 illustrated in FIG. 1A.

The second optical element 112 in FIG. 1B has a spherical form and includes a vertex in the center O as seen from the planar view. The vertex describes the highest point of the second optical element 112. The first optical element 111, the third optical element 113, and the fourth optical element 114 have the same form, which is not a spherical form as seen from the planar view. This form will be described using the first optical element 111 as an example with reference to FIGS. 2A through 2C.

Figure 2A:
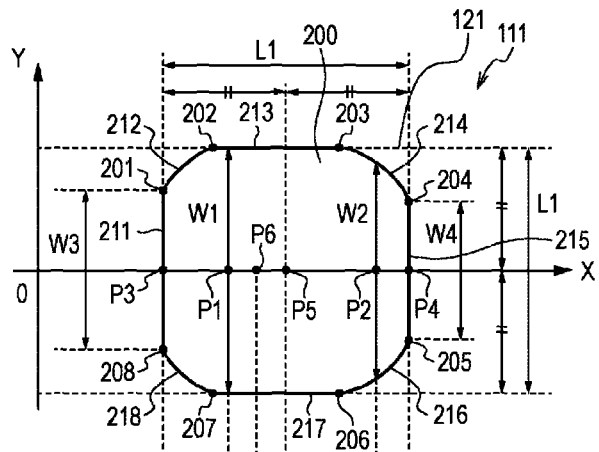
FIG. 2A is a planar schematic describing an optical element according to the First Embodiment.
Figure 2B:
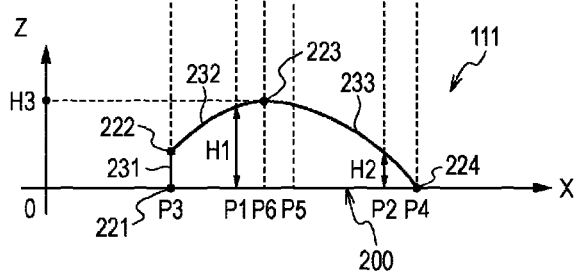
FIGS. 2B and 2C are cross-sectional schematics describing the optical element according to the First Embodiment.
Figure 2C:
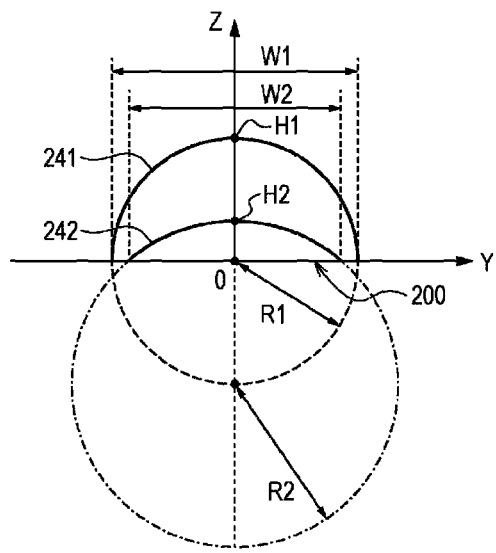

FIG. 2A is a planar schematic of the first optical element 111, and FIGS. 2B and 2C are cross-sectional schematics of the first optical element 111.

FIG. 2A is a planar schematic illustrating a bottom face (bottom surface) 200 of the first optical element 111 in a face (on a plane) including the X axis and the Y axis. The bottom face 200 is equal to the outer edge of the image (orthographic representation) projecting the first optical element 111 on the face including the X axis and the Y axis. The first optical element 111 has a first length L1 along the X axis and the first length L1 along the Y axis as can be seen on the bottom face 200.

First position P1 through sixth position P6 exist along the X axis in the bottom face 200 (in the optical element), which are arranged in order from the center O of the optical element array to the third position P3, the first position P1, the sixth position P6, the fifth position P5, the second position P2, and the fourth position P4.

Of edges of the bottom face 200 of the optical element 111, an edge 211 along the Y axis and closest to the center O of a first region 121, is disposed at the third position P3. Of edges of the bottom face 200 of the optical element 111, an edge 215 along the Y axis and farthest from the center O of the first region 121, is disposed at the fourth position P4. The center of the bottom face 200 of the optical element 111 is disposed at the fifth position P5, which is the position centered between the third position P3 and the fourth position P4. That is to say, the fourth position P4 is positioned away from the third position P3 by the first length L1, and the fifth position P5 is positioned away from the third position P3 by half of the first length L1 (L1/2). The sixth position P6 represents the position of the vertex of the optical element 111 along the X axis, which will be described later. The first region 121 is one lattice of the matrix provided in the array region 120 two-dimensionally. One optical element is provided to one lattice.

As illustrated in FIG. 2A, the bottom face 200 has a form with vertical line symmetry in reference to the X axis, and is configured with outer edges 211 through 218. The edge 211 is a straight line connecting points 201 and 208, and the edge 212 is a curved line connecting points 201 and 202. The edge 213 is a straight line connecting points 202 and 203, and the edge 214 is a curved line connecting points 203 and 204. The edge 215 is a straight line connecting points 204 and 205, and the edge 216 is a curved line connecting points 205 and 206. The edge 217 is a straight line connecting points 206 and 207, and the edge 218 is a curved line connecting points 207 and 208. The edge 211 is a straight line along the X axis. Edges 213 and 217 are straight lines along the Y axis. Edges 212, 214, 216, and 218 have curvature, which connect each of the straight lines.

The bottom face 200 has a first width W1 along the Y axis positioned at the first position P1 regarding the X axis. The bottom face 200 also has a second width W2 along the Y axis positioned at the second position P2 in the X axis. The bottom face 200 also has a third width W3 and a fourth width W4 along the Y axis positioned at the third position P3 and the fourth position P4, respectively. These widths satisfy at least a relationship in which W1 is greater than W2. In addition, it is preferable if they satisfy a relationship in which W1>W2>W3>W4. Regarding FIG. 2A, W1=L1.

The first position P1 is positioned optionally at a distance from the third position P3 that is no more than half of the first length L1. The second position P2 is positioned optionally at a distance from the third position P3 that is at least half of the first length L1. Alternatively, the first position P1 is positioned optionally at a distance closer to the third position P3 that is no more than half of the first length L1. The second position P2 is positioned optionally at a distance from the third position P3 that is at least half of the first length L1. The first position P1 and the second position P2 satisfy a relationship in which P2>P1 regarding the distance from the center O.

FIG. 2B is a cross-sectional schematic of the first optical element 111 along the X axis in FIG. 2A. In the face including the Z axis and the X axis, the first optical element 111 is configured with outer edges 231 through 233 within a cross section 220. The edge 231 is a straight line connecting points 221 and 222. The edge 232 is a curved line connecting points 222 and 223. The edge 233 is a curved line connecting points 223 and 224. The first optical element 111 has a first height H1 positioned at the first position P1, a second height H2 positioned at the second position P2, and a third height H3 positioned at a sixth position P6. The relationship between these heights is H3>H1>H2. The third height H3 is the highest height of the first optical element 111. That is to say, the point 223, which is the sixth position P6, is the vertex of the first optical element 111. The sixth position P6 is the vertex of the first optical element 111, which is closer to the center O than the fifth position P5. Here, the vertex is the highest position within this cross section. According to the present embodiment, the first optical element 111 has a vertex, which does not have to be the highest point. For example, the height H3 from the first position P1 to the fifth position P5 may have the vertex.

Regarding the first optical element 111 as illustrated in FIG. 2B, the edge 232 has a smaller curvature radius than the edge 233. The edge 232 can have a larger curvature radius than the edge 233. According to this configuration, the incident light input onto the edge 233 is significantly bent due to strong lens power, which increases the light collecting efficiency. The curvature radius can be determined from the tangent at any point of the cross section of the optical element. For example, the tangent of the edge 233 at the center point of the edge 233 along the X axis (center between the sixth position P6 and the fourth position P4) can be obtained. The curvature radius can be taken from the inscribed circle of this tangent. In addition, each curvature radius can be obtained using other typical methods for measuring curvature radii.

FIG. 2C illustrates cross sections of the first optical element 111 at the first position P1 and the second position P2 as in FIG. 2A. A cross section 241 is a cross section of the first optical element 111 along the Y axis positioned at the first position P1 as in FIG. 2A. A cross section 242 is a cross section of the first optical element 111 along the Y axis positioned at the second position P2 as in FIG. 2A. Regarding the first cross section 241, the first optical element 111 has a first width W1, and a highest first height H1, which is the vertex of the first cross section 241. This outer edge has a first curvature radius R1 in the first cross section 241. Regarding the second cross section 242, the first optical element 111 has a second width W2, and a highest second height H2, which is the vertex of the second cross section 242. The present embodiment has these vertices, but they do not have to be in the portions containing the previously described first height H1 and the second height H2.

Regarding the second cross section 242, this outer edge has a second curvature radius R2. The relationship between these curvature radii is R1<R2. R1 can be greater than or equal to R2, but in this case the width W2 decreases, which decreases the area occupancy ratio. In this case, the second width W2 of the optical element can configure the outer edge in FIG. 2A. The area occupancy ratio is improved by having an edge that includes the second width W2 positioned the farthest from the center O, which enables a wider range of light to be collected.

As illustrated in FIGS. 2A through 2C, the first optical element 111 has the first width W1, the first height H1, and the first curvature radius R1 positioned at the first position P1, and has the second width W2, the second height H2, and the second curvature radius R2 positioned at the second position P2. In comparison with the related art, the first optical element 111 can maintain a high light collecting ability while having a high occupancy area, which improves the light collecting ratio by establishing the relationships in which W1>W2, H1>H2, and R1<R2. Next, the light collecting ratio will be described with reference to FIGS. 3A through 3D and FIGS. 4A through 4D.

Figure 3A:
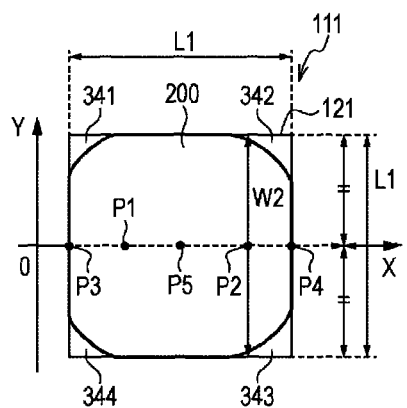
FIGS. 3A and 3B are planar schematics describing the optical element according to the First Embodiment.
Figure 3B:
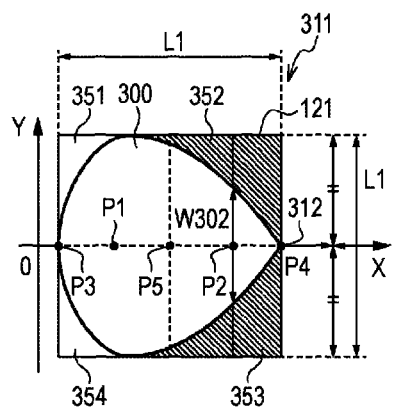
Figure 3C:
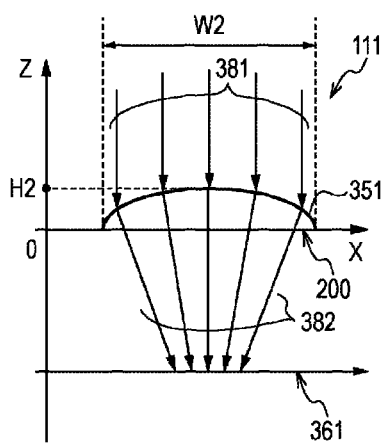
FIGS. 3C and 3D are cross-sectional schematics describing the optical element according to the First Embodiment.
Figure 3D:
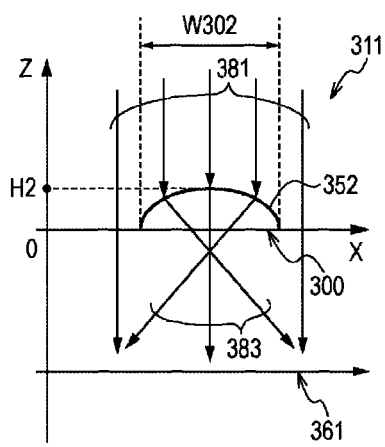

FIGS. 3A through 3D are diagrams comparing the first optical element 111 and a teardrop-shaped optical element 311. FIG. 3A is a planar schematic illustrating the bottom face 200 of the first optical element 111, and FIG. 3B is a planar schematic illustrating a bottom face 300 of the optical element 311 for comparison purposes. FIG. 3C is a cross-sectional schematic of the first optical element 111, and FIG. 3D is a cross-sectional schematic of the optical element 311 for comparison purposes. FIG. 3A illustrates the same first optical element 111 illustrated in FIG. 2A, and so its reference numerals and detailed description are omitted. The first region 121 is set in FIG. 3A through 3D for the description of the area. The first region 121 is a square in which one edge has the first length L1, and is also a rectangle circumscribing the outer edge of each optical element. In FIGS. 3A through 3D, each optical element is provided with the first region 121. The first optical element 111 and the optical element 311 have equivalent forms regarding the first position P1.

As illustrated in FIG. 3B, the optical element 311 has the bottom face 300. The width of the bottom face 300 along the Y axis from the fifth position P5 decreases toward the fourth position P4, terminating at a point 312, which is the fourth position P4. That is to say, the bottom face 300 of the optical element 311 has less area than the bottom face 200 of the optical element 111. As previously described and according to the present embodiment, the image of the orthogonal projection of the optical element is equal to the bottom face, and so the area of the optical element 111 is larger than that of the optical element 311. Regarding FIG. 3A, regions 341 through 344 are portions not included in the bottom face 200 regarding the first region 121. Regarding FIG. 3B, regions 351 through 354 are portions not included in the bottom face 300 regarding the first region 121. These regions 341 through 344 and regions 351 through 354 are not included in the optical element, and so these regions do not collect light (invalid regions). As previously described, the sum of the areas of the regions 341 through 344 is less than the sum of the area of the regions 351 through 354.

The area occupancy ratio is the ratio of the area provided to the optical element in relation to the area of the first region 121 regarding the face including the X axis and the Y axis. As previously described, the area occupancy ratio of the first optical element 111 is larger than the area occupancy ratio of the optical element 311 for comparison purposes. Specifically, the area occupancy ratio of the first optical element 111 is approximately 91%, whereas the area occupancy ratio of the optical element 311 for comparison purposes is approximately 73%. If 100% of all light incident on the first region 121, there is a difference of slightly less than 20% in the amount of light than can be collected. The first optical element 111 has a higher area occupancy ratio as compared with the configuration of the related art, which enables a higher light collecting ratio.

FIG. 3C is a cross-sectional diagram illustrating a cross section 351 along the Y axis of the first optical element 111 at the second position P2 as in FIG. 3A. FIG. 3D is a cross-sectional diagram illustrating a cross section 352 along the Y axis of the optical element 311 for comparison purposes at the second position P2 as in FIG. 3B. A virtual incident face 361 at an equal distance from the bottom face is provided in FIGS. 3C and 3D to illustrate the behavior of light by each optical element. Equivalent light 380 and 381 is incident on either optical element. The optical element 111 has the width W2 at the second position P2, and has the second curvature radius R2, which is larger than the first curvature radius R1 at the first position P1, and so the light-collecting power of the optical element 111 is not significant. Therefore, the optical element 111 collects most of the light 381, and the incident face 361 can collect an accumulated light 382 at a suitable position. Conversely, the optical element 311 has a width W302 which is narrower at the second position P2, and so has a smaller curvature radius. Therefore, the optical element 311 can only collect a portion of the light 381. In addition, as the curvature radius is small, a significant refraction occurs in the optical element 311, and a light 383 strays due to the large angle of the incident face 361. Compared to the configuration of the related art in this way, the form of the optical element 111 improves the light-collecting capacity and the area occupancy ratio, which improves the light collecting ratio.

Figure 4A:
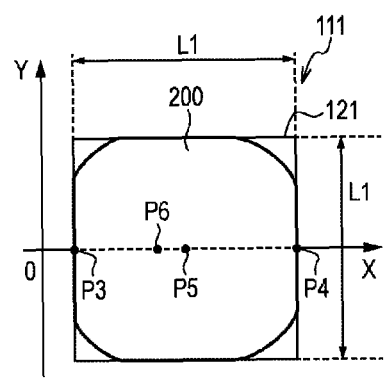
FIGS. 4A and 4B are planar schematics describing the optical element according to the First Embodiment.
Figure 4B:
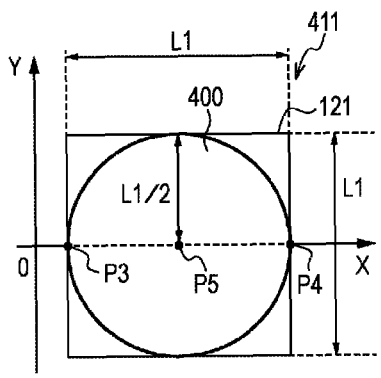
Figure 4C:
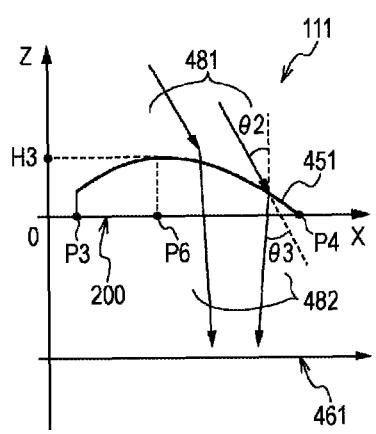
FIGS. 4C and 4D are cross-sectional schematics describing the optical element according to the First Embodiment.
Figure 4D:
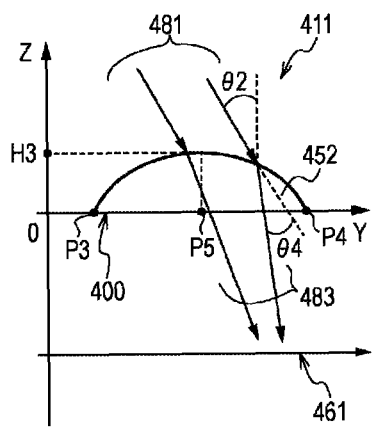

Next, the first optical element 111 and a hemispherical lens 411, which is a different configuration of the related art, will be compared using FIGS. 4A through 4D. FIG. 4A is a planar schematic illustrating the bottom face 200 of the first optical element 111, and FIG. 4B is a planar schematic illustrating a bottom face 400 of an optical element 411 for comparison purposes. FIG. 4C is a cross-sectional schematic of the first optical element 111, and FIG. 4D is a cross-sectional schematic of the optical element 411 for comparison purposes.

FIGS. 4A and 4C illustrate the same first optical element 111 illustrated in FIGS. 2A and 2B, and so its reference numerals and detailed description are omitted. In FIGS. 4A through 4D, the first region 121 having the same area is provided to each optical element.

As illustrated in FIG. 4B, the optical element 411 has the bottom face 400. The bottom face 400 is a circle with a radius that is half of the first length L1 (L1/2). As illustrated in FIG. 4B, the vertex of the optical element 411 is positioned at the fifth position P5, which is the center of the first region 121.

FIG. 4C is a cross-sectional schematic illustrating a cross section 451 of the optical element 111 along the X axis as in FIG. 4A. FIG. 4D is a cross-sectional schematic illustrating a cross section 452 of the optical element 411 along the X axis as in FIG. 4B. The height of the vertex for both optical elements is the third height H3. A virtual incident face 461 at an equal distance from the bottom face is provided in FIGS. 4C and 4D to illustrate the behavior of light by each optical element. A diagonal light 481 having an angle θ2 in relation to the normal line of the light-receiving face of the optical element is illuminated onto both optical elements.

The incident light 481 input onto the optical element 411, for example, is collected as a light 483 including light that has an angle θ4 in relation to the light 481. Conversely, the incident light 481 input onto the optical element 111, for example, is collected as a light 482 including light having an angle θ3, which is larger than the angle θ4, in relation to the light 481. As illustrated by the cross section 451 which has a boundary that is indicated by the sixth position P6, the optical element 111 refracts light differently at each edge that has a gradually changing inclination. According to the present embodiment, the curvature radius at the first position P1 is smaller than the curvature radius at the second position P2. When compared with the optical element 411, at a position nearby the fourth position P4 the optical element 111 can collect diagonal incident light more efficiently by changing diagonal incident light (angle θ2) to light that is along the Z axis (angle θ3). When the angle θ2 is between 20 to 40 degrees, the pixel sensitivity when using the first optical element 111 is increased by 10 to 20% over the optical element 411.

Compared with the related art, such a first optical element 111 maintains a high light collecting capacity while having a high occupancy area, which enables a high light collecting ratio. Therefore, an optical element array having a high light collecting ratio can be provided by providing at least one first optical element 111 positioned away from the center O of the array region 120 by the first distance D1.

The second position P2 can also be the fourth position P4 as long as the previously described conditions are satisfied. That is to say, the edge 215 can have the second width W2. This enables a higher area occupancy ratio over the previously described form.

The vertex of the optical element may be at the first position P1. That is to say, the sixth position P6 can be at the same position as the first position P1. According to the present embodiment, the first width W1 of the first position P1 is the widest width. However, the position with the widest width may be different, and is preferably between the fifth position P5 and the second position P2. The area occupancy ratio can be further improved by having the widest width in such a position.

According to the present embodiment, the first region 121 is represented as having a square form. However, when seen from the planar view, the first region 121 may be rectangular where the outer edges circumscribe the optical element, and this rectangular form can have edges of the first length L1. Multiple optical elements can be arranged at least one dimensionally. The third width W3 at the third position P3 can be equal to L1.

According to the present embodiment, the first length L1 is at least 0.5 μm and no more than 50 μm. The first width W1 and the second width W2 are at least 0.5 μm and no more than 50 μm, and the ratio between the first width W1 and the second width W2 is within a range between 0.05 and 0.99. This range is preferably between 0.2 and 0.8. The first height H1 and the second height H2 are at least 0.1 μm and no more than 5.0 μm. The value of the first curvature radius R1 is determined by the first height H1 and the first width W1. The value of the second curvature radius R2 is determined by the second height H2 and the second width W2. These values are generally at least 0.25 μm and no more than 100 μm. Thus, the width, height, and curvature radius of the first optical element should be set so that the area occupancy ratio is at least 80%. Regarding the solid-state imaging device, if the area occupancy ratio of the first optical element is less than 80%, the amount of light not collected will be at least 20%, which creates a problem of prominent shading around the perimeter of the image.

The first optical element according to the present embodiment, for example, can have a form using photolithography techniques. In this case, the desired optical element can be obtained by exposing and developing the photoresist in the exposure device which uses a gray tone mask or an area gradation mask which can obtain a transmissivity obtained from design data regarding the form of the first optical element.

Figure 5:
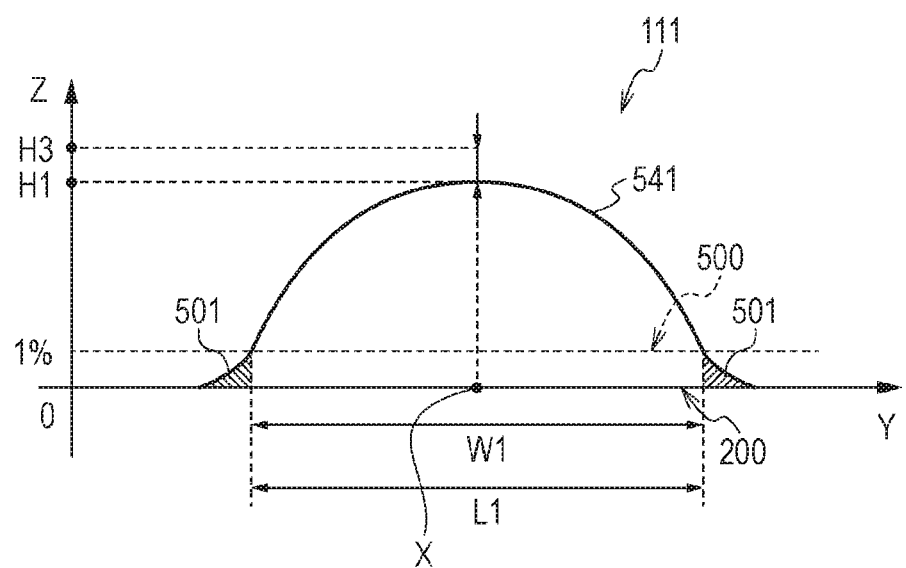
FIG. 5 is a cross-sectional schematic describing an optical element according to the First Embodiment.

The first optical element after manufacturing will be described with reference to FIG. 5. FIG. 5 is a cross-sectional schematic illustrating a cross section 541, which corresponds to the cross section 241 in FIG. 2C. In FIG. 5, the configuration is the same as that in FIG. 2C, and thus has the same reference numerals, and such description is omitted. The optical element 111 has a portion 501 extending toward the bottom face 200 in the portion connecting with the bottom face 200. The spread of this portion connecting the bottom face 200 may occur in any portion. When measuring the first width W1, the second width W2, and so on, it is preferable to measure by taking a cross section 500, which is parallel to the bottom face 200, at the point (X axis position) that has a height of 1% of the third height H3, which is the highest point of the first optical element 111. When joining adjacent optical elements, measure the length and width at this junction.

Second Embodiment

Figure 6A:
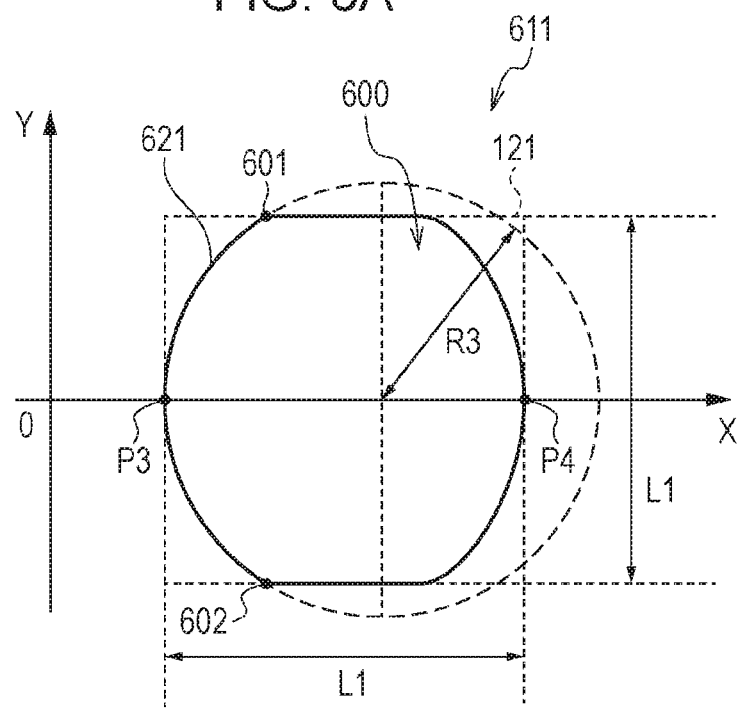
FIGS. 6A and 6B are planar schematics describing the optical element according to a Second Embodiment.
Figure 6B:
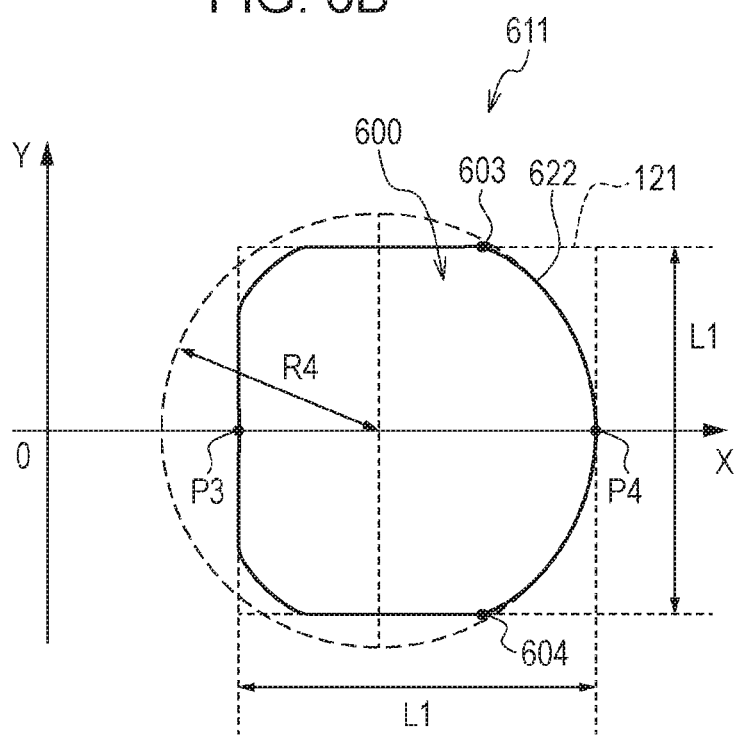

A first optical element 611 according to the present embodiment has a modified version of the bottom face 200 of the first optical element 111 according to the First Embodiment. FIGS. 6A and 6B are planar schematics corresponding to FIG. 2A. Reference numerals and descriptions are omitted for the portions of the configuration that are the same. FIGS. 6A and 6B are planar schematics illustrating the same optical element 611. The optical element 611 has a bottom face 600. The bottom face 600 does not have edges corresponding to edges 211 and 215, which are included in the bottom face 200 of the optical element 111 in FIG. 2A.

As illustrated in FIG. 6A, the outer edge of the bottom face 600 has a curved edge 621, which connects from a point 601 to a point 602, which passes through the third position P3. The bottom face 600 has a third curvature radius R3 at the third position P3. The third curvature radius R3 is at least half of the first length L1, which is to say, has a relationship in which R3≥(L1/2). The area occupancy ratio can be improved with a form having such a curvature radius. As illustrated in FIG. 6B, the outer edge of the bottom face 600 has a curved edge 622, which connects from a point 603 to a point 604, which passes through the fourth position P4. The bottom face 600 has a fourth curvature radius R4 at the fourth position P4. The fourth curvature radius R4 is at least half of the first length L1, which is to say, has a relationship in which R4≥(L1/2). The width along the Y axis increases due to a form having such a curvature radius, which improves the area occupancy ratio. As the width along the Y axis increases, the curvature radius in the cross section along the Y axis also increases, which can reduce the occurrence of stray light due to the curvature radius being too small, which is to say, the refraction angle being too large.

The present embodiment exhibits a configuration in which the curvature radius of the bottom face at two positions is at least L1/2, but the curvature radius at only one of these positions of the bottom face needs to be at least L1/2.

Third Embodiment

A first optical element 711 according to the present embodiment has a modified version of the bottom face 200 of the first optical element 111 according to the First Embodiment. FIG. 7A is a planar schematic corresponding to FIG. 2A. Reference numerals and descriptions are omitted for the portions of the configuration that are the same.

Figure 7:
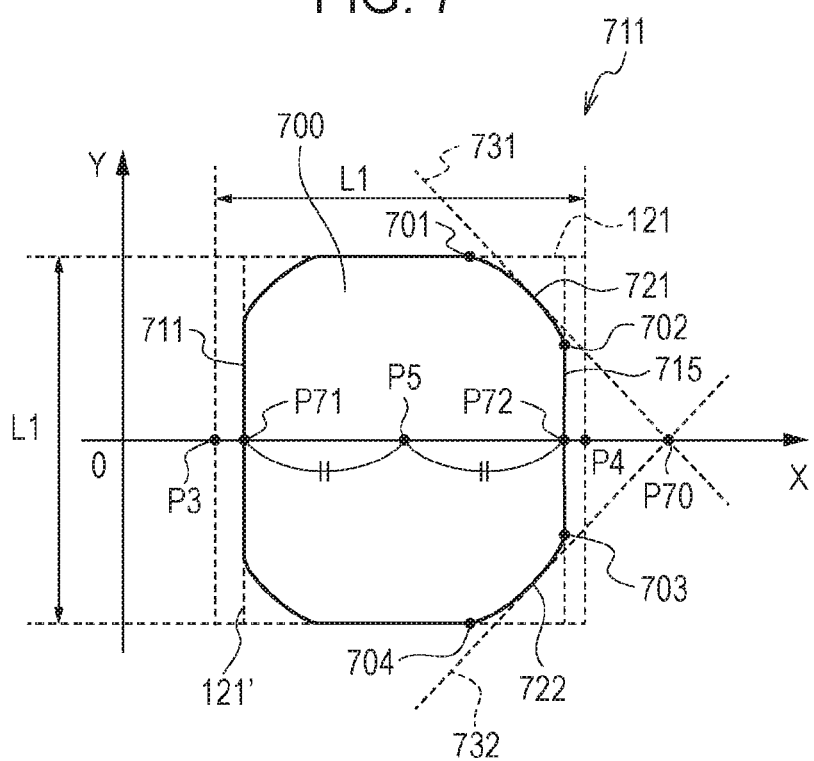
FIG. 7 is a planar schematic describing an optical element according to a Third Embodiment.

The optical element 711 in FIG. 7 has a bottom face 700. The center of the optical element 711 in the X axis is positioned at the fifth position P5. However, the end of the bottom face 700 in the X axis is between a position P71 and a position P72. An edge 711 corresponding to the edge 211 in FIG. 2A is positioned at the position P71 instead of the third position P3, and an edge 715 corresponding to the edge 215 in FIG. 2A is positioned at the position P72 instead of the fourth position P4. That is to say, the length of the optical element 711 in the X axis is shorter than the first length L1. That is to say, there is a gap between adjacent optical elements. In this case, the area occupancy ratio regarding a first region 121' circumscribing the optical element can be increased as compared with the optical element according to the related art. By adjusting the width of the gap between the adjacent optical elements, pupil correction can be readily performed as well as simplifying the manufacturing process between adjacent optical elements. The width of the gap is no more than L1/2 regarding the X axis length of the optical element, and in particular, is preferably no more than L1/4.

In FIG. 7, the intersection of a tangent 731 of an edge 721, which is a curve, connecting from a point 701 to a point 702 and a tangent 732 of an edge 722, which is a curve, connecting from a point 703 to a point 704 is positioned at a position P70, which is farther from the center O than the position P72. The optical element having a high area occupancy ratio has such an intersection of tangents.

The present embodiment exhibits a form in which the optical element 711 has a gap in the X axis, but the form may have a gap in the Y axis, or the form may have gaps in both the X axis and Y axis.

The boundary between the optical element and the adjacent optical element, for example, may be positioned in between the center of the length of the optical element in the X axis and the center of the length of the adjacent optical element. This can be the same in the Y axis, and other directions can also be specified in the same way. The outer edge of the optical element, for example, contacts with the outer edge of an adjacent optical element at a cross-section following the X axis, and can be obtained from a point in which the inclination of the tangent of the outer edge of the optical element becomes zero in the cross section along the X axis. The length of the optical element in the X axis can be obtained, for example, by obtaining the distance at positions in the X axis at two points where the inclination of the outer edge of the optical element becomes zero. This can be obtained in the same way when the optical element makes contact with an adjacent optical element.

Fourth Embodiment

Figure 8A:
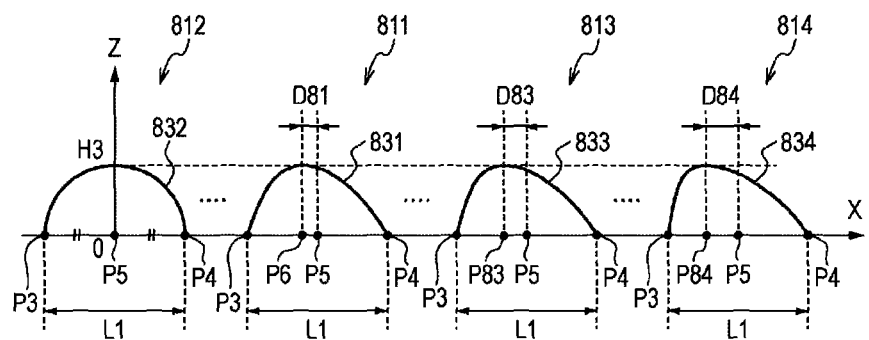
FIG. 8A is a cross-sectional schematic describing an optical element array according to a Fourth Embodiment.

The present embodiment describes a case in which the form of the third optical element 113 and the fourth optical element 114 in FIGS. 1A and 1B is different from the first optical element 111. A first optical element 811 has the same structure as the first optical element 111 in FIG. 2B. FIG. 8A is a cross-sectional schematic of a first optical element 811 through a fourth optical element 814 illustrating cross sections 831 through 834 which correspond to the cross sections in FIG. 2B, respectively. As illustrated by the cross sections 831 through 834, the first optical element 811 through the fourth optical element 814 all have different forms. The first optical element 811 through fourth optical element 814 each have an equivalent third height H3 and a first length L1.

The positions of the vertex of the first optical element 811 through fourth optical element 814 are different. The vertex of the first optical element 811 is the sixth position P6, the vertex of the second optical element 812 is the fifth position P5, the vertex of the third optical element is a position P83, and the vertex of the fourth optical element 814 is a position P84. At this time, the position of the fifth position P5, which is the center of each optical element in the X axis, is separated by a distance D82 (not illustrated) in the second optical element 812, and by a distance D81 (fourth distance) in the first optical element 811. The position of the vertex from the fifth position P5, which is the center of each optical element in the X axis, is separated by a distance D83 (fifth distance) in the third optical element 813, and by a distance D84 in the fourth optical element 814. The distance D82 is zero. The distance has a relationship in which D82=0<D81<D83<D84. That is to say, the optical elements positioned farther from the center O of the array region have vertices provided farther from the center of the optical element in the X axis. By changing the position of the vertex of each optical element in the optical element array from the center O toward the outer edge, variance in the light collecting ratio (decreases in the amount of light collected at the perimeter of the array region) in the array region can be suppressed.

Figure 8B:
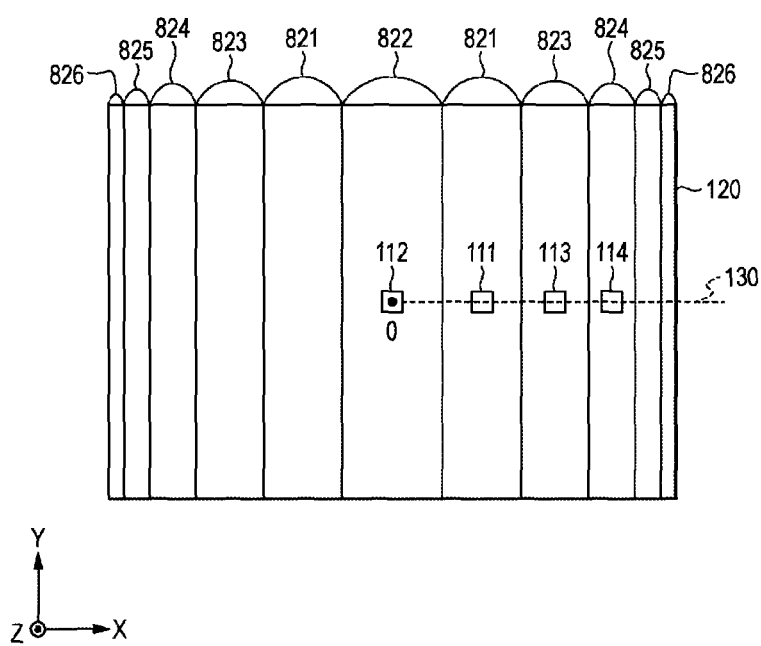
FIG. 8B is a planar schematic describing an optical element array according to the Fourth Embodiment.

As illustrated in FIG. 8B, the array region 120 is preferably configured including multiple zones 821 through 826. The multiple zones each have a band shape which is a rectangle shape in planar view, and includes the first zone 821 provided with the first optical element 811 and the second zone 822 provided with the second optical element 812 and positioned closer to the center O of the array region 120 than the first zone 821. Multiples of the first optical element 811 are provided in the first zone 821, and multiples of the second optical element 812 are provided in the second zone 822. The third zone 823 and the fourth zone 824, which are further from the center O than the first zone 821 may also be included. Multiples of the third optical element 813 are provided in the third zone 823, and multiples of the fourth optical element 814 are provided in the fourth zone 824. Optical elements of equivalent form are provided in each respective zone, which simplifies the design as compared with the case of changing the form for all optical elements.

The method to provide multiple zones will be described using a case of applying the optical element array to the solid-state imaging device as an example. Generally, a smaller number of zones simplifies the design of the optical element array. However, when the number of zones is small, the difference between the form of the optical elements provided in adjacent zones increases. The difference in form, for example, may create a difference in the light collecting ratio at the zone boundary, which may result in a difference in pixel sensitivity in the solid-state imaging device and differences in luminance in the image. It is necessary to reduce the difference in optical element form provided in adjacent zones to reduce differences in luminance. The difference in volume is preferably kept within a range between 95% to 105% of the volume of the adjacent optical element. Thus, it is preferable to adjust the number of zones so that the difference in volume is no more than ±5%.

The form of the zone can be set as desired, such as by changing the length of the X axis of each zone as exhibited by the present embodiment. Specifically, when looking at the X axis, the length of the first zone 821 is shorter than the second zone 822, but longer than the third zone 823. The length of the third zone 823 is longer than the length of the fourth zone 824. However, the length of each zone can be the same. The length here represents the length along the X axis from the boundary between the first zone 821 and the second zone 822 to the boundary between the first zone 821 and the third zone 823.

Figure 9A:
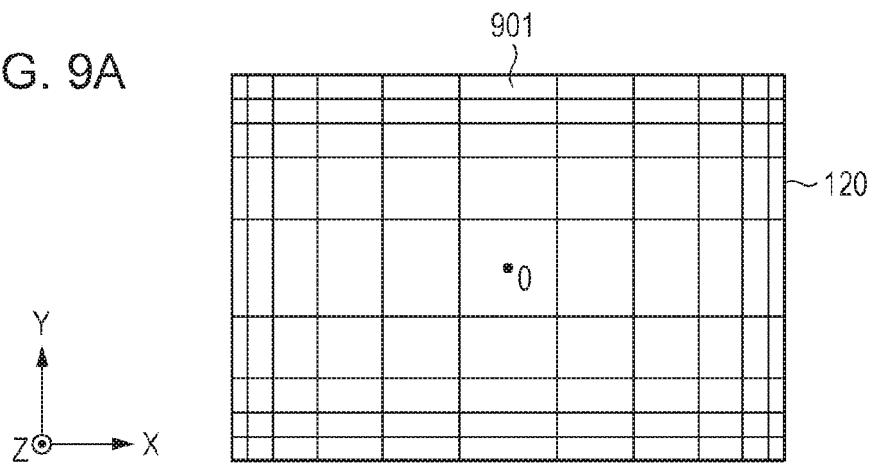
FIGS. 9A through 9C are planar schematics describing a modification of the optical element array according to the Fourth Embodiment.

As illustrated in FIG. 9A, the array region 120 may further divided into a lattice form, for example, and the size of each zone 901 may be set as desired. In the case of that in FIG. 9A, the closer the zone 901 is to the center O, the more the area of the zone 901 increases. Variances in the light collecting ratio can be reduced with such a form.

Figure 9B:
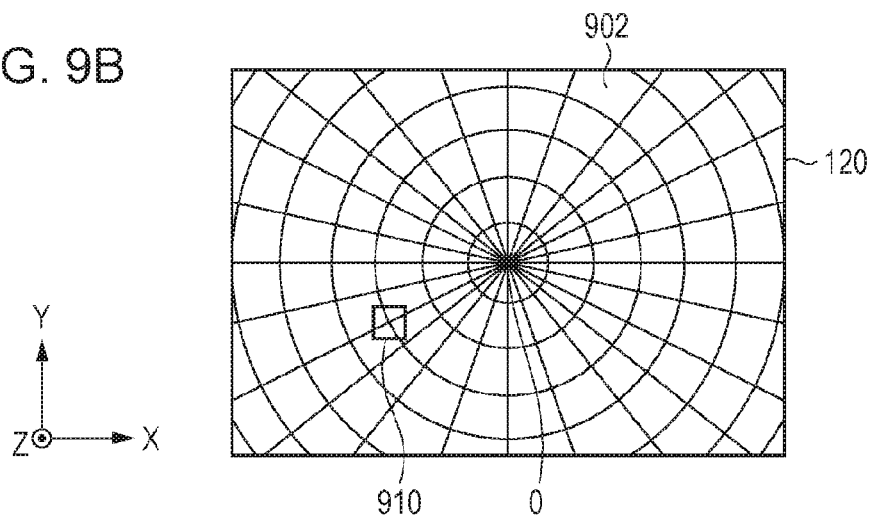
Figure 9C:
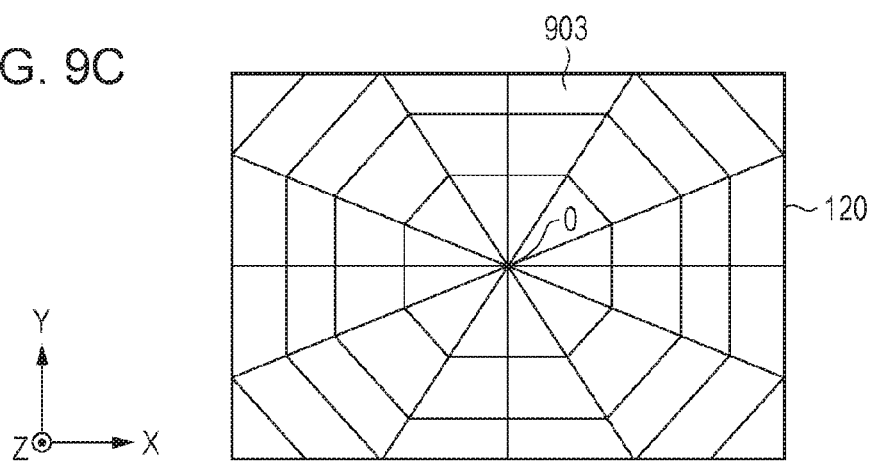

As illustrated in FIG. 9B, a zone with a concentric shape may be provided for the center of the center O, and then the array can be divided with zones 902 expanding radially from the center O. A plurality of zones with the concentric shape share the center O, and do not share outer circumferences. An outer circumference of the outer circumferences is within another one of the outer circumferences. As illustrated in FIG. 9C, a zone with a polygonal shape may be provided centered on the center O, and then the array can be divided with zones 903 expanding radially from the center O.

Regarding the cases illustrated in FIGS. 9A through 9C, the length of zones refers to the length along a certain axis regarding the boundaries of a certain zone, between the boundary of the zone and an adjacent zone and the boundary of the zone and another adjacent zone.

Fifth Embodiment

The present embodiment is related to the boundaries of zones according to the Fourth Embodiment. FIGS. 10A through 10E are expanded planar schematics of the boundaries between multiple zones.

Figure 10A:
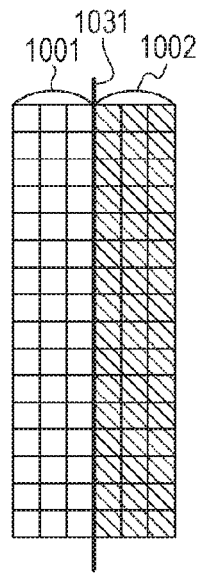
FIGS. 10A through 10E are planar schematics describing an optical element array according to a Fifth Embodiment.
Figure 10B:
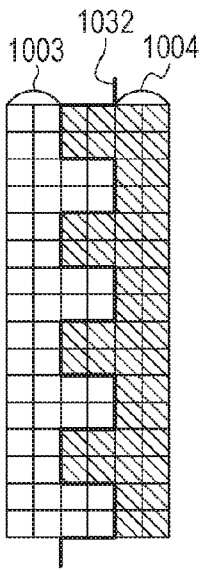

FIGS. 10A through 10D illustrates the boundaries between two zones. FIG. 10A illustrates the boundary between a zone 1001 and a zone 1002, and this boundary is represented by a straight line 1031. Conversely, FIG. 10B illustrates the boundary between a zone 1003 and a zone 1004, and the boundary is represented by a zigzag line 1032. By designing such a configuration, differences in image levels due to differences in the light collecting ratio between the optical elements having different forms with adjacent portions can be reduced as compared with that in FIG. 10A.

Figure 10C:
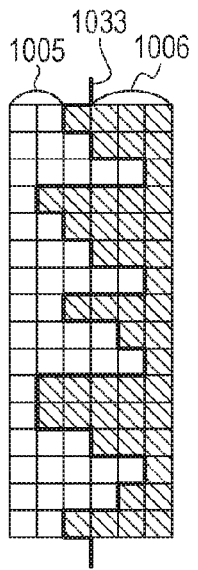

FIG. 10C illustrates the boundary between a zone 1005 and a zone 1006, and the boundary is represented as an irregular zigzag line 1033. By using such a form having no regularity, differences in image levels due to differences in the light collecting efficiency between the optical elements having different forms with adjacent portions can be reduced as compared with that in FIG. 10B.

Figure 10D:
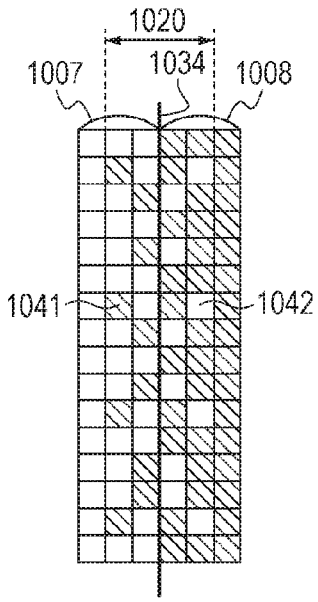

FIG. 10D illustrates the boundary between a zone 1007 and a zone 1008, and this boundary is represented by a straight line 1034. However, both zones 1007 and 1008 have buffer regions 1020 including the line 1034. The buffer regions 1020 partly contain the type of optical element used in the other zone. For example, an optical element 1014 of the zone 1008 is provided in the zone 1007, and an optical element 1042 of the zone 1007 is provided in the zone 1008. In this way, by switching several of the optical elements between zones at the boundary, differences in image levels due to differences in the light collecting ratio between optical elements having a form different to adjacent portions can be reduced.

Figure 10E:
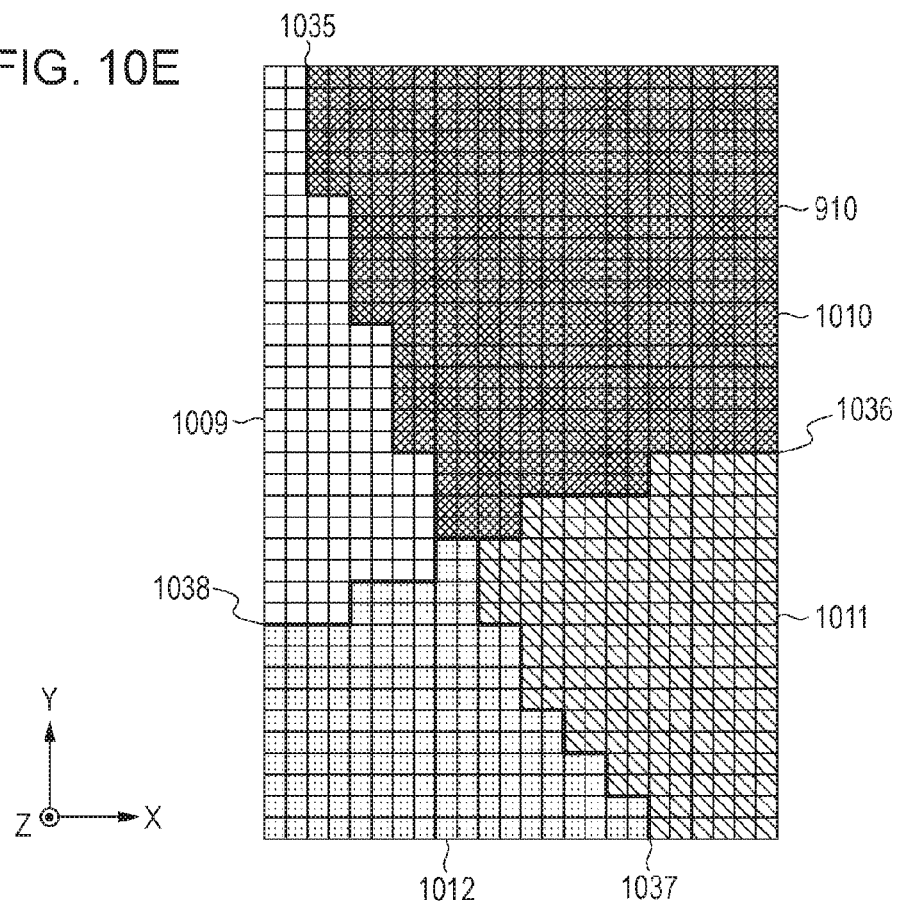

FIG. 10E illustrates an expanded diagram of the boundary region 910 in FIG. 9B. The boundaries of the boundary region 910 between the four zones 1009 through 1012 are represented by zigzag lines 1035 through 1038. As illustrated in FIG. 10E, the points where the four zones 1009 through 1012 connect can be provided so that the two zones 1010 and 1012 are positioned between the two zones 1009 and 1011.

Sixth Embodiment

The optical element array according to the present embodiment will be described with reference to FIG. 11. The present embodiment is a different method from that of the Fourth Embodiment to differentiate the forms of the multiple optical elements. FIG. 11 is a planar schematic of a first optical element 1111, a third optical element 1113, and a fourth optical element 1114. The second optical element is similar to that of the Fourth Embodiment, and so its reference numerals and description are omitted.

The first optical element 1111 has a bottom face 1131 with a center of gravity G1. The third optical element 1113 has a bottom face 1133 with a center of gravity G3. The fourth optical element 1114 has a bottom face 1134 with a center of gravity G4. The center of gravity G1 is positioned at a point P111, the center of gravity G3 is positioned at a point P113, and the center of gravity G4 is positioned at a point P114. The distance between these points and the fifth position P5, which is the center of the optical element, are represented by distances D1151, D1153 through D1154, and these distances have a relationship in which D1151<D1153<D1154. An optical element array having such a configuration of optical elements enables variance in the light collecting ratio between array regions to be reduced.

Seventh Embodiment

According to the present embodiment, a case in which the previously described optical element array is applied to a solid-state imaging device will be described with reference to FIG. 12. According to the present embodiment, the solid-state imaging device is a CMOS sensor.

A solid-state imaging device 1200 includes a semiconductor portion 1280 and an optical element array 1270 provided on the semiconductor portion 1280. The optical element array 1270 includes multiple optical elements. FIG. 12 illustrates a first optical element 1211, a third optical element 1213, and a fourth optical element 1214. The second optical element is similar to that of the other embodiments, and so its reference numerals and description are omitted.

The semiconductor portion 1280 has multiple pixels arranged so that each pixel corresponds to each of the multiple optical elements. FIG. 12 illustrates a first pixel 1291 corresponding to the first optical element 1211, a third pixel 1293 corresponding to the third optical element 1213, and a fourth pixel 1294 corresponding to the fourth optical element 1214. The length of each optical element and each pixel is equivalent to the first length L1. That is to say, the spacing between the multiple optical elements and the spacing between the multiple pixels is the same. Therefore, in FIG. 12, each pixel is in a one-to-one correspondence with each optical element.

Each pixel on the semiconductor portion 1280 has a photoelectric conversion element provided to a semiconductor substrate 1281. The photoelectric conversion element has, for example, an N-type semiconductor region 1282 that can hold an electric charge provided to a P-type semiconductor region. Multiple wiring layers 1284 and insulating layers 1283 made from insulating material provided between each wiring layer are provided on the semiconductor substrate 1281. A protective layer 1285 and a planarization layer 1286 are provided on the insulating layer 1283. For example, the semiconductor substrate 1281 is made from silicon, the insulating layer 1283 is made from silicon oxide, and the multiple wiring layers 1284 are made from conductive materials, such as copper as the main material. The protective layer 1285 is made from silicon nitride, and the planarization layer 1286 is made from organic material, for example. Transistor circuits, element isolators, plugs, and so on are provided between each wiring layer and the semiconductor substrate 1281, but these are not illustrated in FIG. 12, as those elements are known to persons having ordinary skill in the art.

Regarding the optical element array according to the present embodiment, the center fifth position P5 of each optical element varies in correspondence with the position of the center of each pixel. The position of the center of each pixel is represented by a position P12 illustrated on the face of the semiconductor region 1282. For example, the first optical element 1211 varies from the center O by a distance 1201 with the first pixel 1291. The third optical element 1213 varies from the center O by a distance 1203 with the third pixel 1293. The fourth optical element 1214 varies from the center O by a distance 1204 with the fourth pixel 1294. In this way, by varying the position of the optical element with regard to the center O along the direction of the center O, variances in the light collecting ratio (shading) that may occur by application to a solid-state imaging device can be reduced.

The distances D1201, D1203, and D1204 representing the amount variance between each optical element and the corresponding pixel have a relationship in which D1201<D1203<D1204. In this way, shading can be further reduced by increasing the amount of variance between the optical element positioned away from the center O and the corresponding pixel.

When varying the positional relationship between the center of the multiple optical elements and the center of the multiple pixels, the spacing between the multiple optical elements can be different from the spacing between the multiple pixels. The center of the optical element is, for example, the center of the length of the optical element along the X axis and the center of the width of the optical element along the Y axis. The center of the pixel is for example, the center along the X axis of regions provided in repeating units and the center along the Y axis. The size of the multiple optical elements along the X axis and the size of the pixels can be changed, for example. The size of each optical element along the X axis, for example, can also be different. In this way, the size and position of the optical element can be set as desired to reduce variance in the light collecting ratio of the array region.

According to the present embodiment, the solid-state imaging device is a CMOS sensor, but may also be a CCD sensor, a backlit type of sensor, or a sensor having a form with a color filter or a form with a waveguide.

The solid-state imaging device according to the present embodiment is included in an imaging system such as a camera typically. The concept of the imaging system is not limited to an apparatus intended primarily for shooting images, and so also includes apparatuses equipped with supplementary shooting functions (for example, a personal computer or mobile device). The imaging system includes the solid-state imaging device related to the present invention illustrated by the previously described embodiments and a signal processing unit for processing signals output from the solid-state imaging device. This signal processing unit includes known electronic circuitry, for example, an A/D (analog-to-digital) converter and a central processing unit (CPU) of one or more processors (multi-core) operatively connected to memory storing instructions for processing the digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An optical element arranged in a peripheral portion of an array region in which a plurality of optical elements is disposed, wherein an outer edge of the optical element, projected on a face including a first direction and a second direction orthogonal to the first direction, has a first width along the second direction and a second width, along the second direction, arranged on a side closer to the peripheral portion of the array region than a position where the first width is arranged,
   wherein a height of the optical element at the position where the first width is arranged is higher than a height of the optical element at a position where the second width is arranged, and
   wherein a curvature radius of the optical element at a cross section along the second direction gradually increases from the position where the first width is arranged toward the position where the second width is arranged.

2. The optical element according to claim 1, wherein a length of the first width and a length of the second width are equal to each other.

3. The optical element according to claim 1, wherein the outer edge of the projected optical element includes a side extending along the second direction on a side of the peripheral portion of the array region.

4. The optical element according to claim 1, wherein the outer edge of the projected optical element includes a side extending along the second direction on a center side of the array region.

5. The optical element according to claim 1, wherein an area surrounded by the outer edge of the projected optical element has an area of 80% or more to an area of a rectangle which surrounds the outer edge of the projected optical element in a manner so as to contact an outer periphery of the outer edge of the projected optical element.

6. The optical element according to claim 1, wherein an area surrounded by the outer edge of the projected optical element is 80% or more of an area of a rectangle circumscribing the outer edge of the projected optical element.

7. The optical element according to claim 1,
   wherein the outer edge of the projected optical element includes a first end portion extending along the second direction and a second end portion extending along the second direction, and
   wherein a position where the first end portion is arranged is closer to a center of the array region than a position where the second end portion is arranged.

8. An optical element array comprising
   the optical element according to claim 1,
   wherein a plurality of the optical elements is disposed in the peripheral portion.

9. The optical element array according to claim 8, further comprising another optical element which has a spherical form in a planar view and is arranged in a center of the array region.

10. A solid-state imaging device comprising:
    the optical element array according to claim 8; and
    a plurality of pixels which is arranged in such a manner that each of the plurality of pixels corresponds to a different one of the plurality of the optical elements.

11. The solid-state imaging device according to claim 10, wherein each distance in the first direction between centers of adjacent optical elements in the plurality of the optical elements and a corresponding spacing in the first direction between centers of adjacent pixels in the plurality of pixels are different from each other.

* * * * *